United States Patent
Kaluza et al.

(10) Patent No.: US 6,178,077 B1
(45) Date of Patent: Jan. 23, 2001

(54) ELECTRONIC BRANCH SWITCHING DEVICE

(75) Inventors: Peter Kaluza, Rieden; Reinhard Maier, Herzogenaurach; Heinz Mitlehner, Uttenreuth; Christian Schreckinger, Kötzting; Gerhard Schröther, Amberg, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/155,365

(22) PCT Filed: Mar. 13, 1997

(86) PCT No.: PCT/DE97/00503

§ 371 Date: Sep. 28, 1998

§ 102(e) Date: Sep. 28, 1998

(87) PCT Pub. No.: WO97/36373

PCT Pub. Date: Oct. 2, 1997

(30) Foreign Application Priority Data

Mar. 27, 1996 (DE) ................................ 196 12 216

(51) Int. Cl.[7] .................................................. H02H 3/00
(52) U.S. Cl. ............................................ 361/101; 361/100
(58) Field of Search .................... 361/76, 75, 78, 361/82, 90, 91.4, 91.2, 92, 93.5, 95, 100, 101

(56) References Cited

U.S. PATENT DOCUMENTS

| | | | |
|---|---|---|---|
| 3,879,652 | * 4/1975 | Billings | 361/100 |
| 3,906,309 | * 9/1975 | Sullivan | 361/98 |
| 4,493,002 | * 1/1985 | Pelowski et al. | 361/93 |
| 4,924,343 | * 5/1990 | Niemi | 361/98 |
| 5,216,352 | * 6/1993 | Studtmann et al. | 323/241 |
| 5,627,717 | * 5/1997 | Pein et al. | 361/95 |

OTHER PUBLICATIONS

"Le Relais Statique: Necessaire Pour Les Charges Reactives," *Electronique*, Oct. 1993, No. 31, p. 43, English translation provided.

* cited by examiner

*Primary Examiner*—Josie Ballato
*Assistant Examiner*—Kim Huynh
(74) *Attorney, Agent, or Firm*—Kenyon & Kenyon

(57) ABSTRACT

The switching functions of switching a load on and off in normal operation and in fault operation are implemented in a simple manner in an electronic branch circuit switch, which is advantageously made with silicon carbide semiconductor switching elements and has a potential-free control device, a device for detection and immediate shutoff in the event of a short-circuit, and a protection device for detection and shutoff against overload currents, as well as an overvoltage limiting device.

3 Claims, 2 Drawing Sheets

ELECTRONIC BRANCH SWITCHING DEVICE

FIELD OF THE INVENTION

The invention present relates to a branch-circuit switch.

BACKGROUND INFORMATION

Branching is usually performed by connecting different switches in series as described in the Siemens manual "Schalten, Schützen, Verteilen in Niederspannungsnetzen" (Switching, Protecting, and Distributing in Low-Voltage Networks 1992 Edition, Table 3.17, p. 143), where a circuit breaker, a contactor, and an overload protection is connected between a motor and the voltage source supplying it with power. Three-phase power controllers, semiconductor relays, rectifiers, mechanical limiters, motor protection switches, and fuses, as well as indirect overload relays, are known as additional switching elements and components for controlling loads. Different switching sequences are performed with such low-voltage branching. These include operational switching of loads, phase-controlled or generalized phase controlled switching of motors, capacitors, and non-linear loads such as lamps and inductors. In the case of inductors, switching occurs instantaneously, e.g., at zero crossing or between zero crossings. Short-circuit currents in the branch circuit are intensity-limited to avoid harmful overloads. Another function of the low-voltage branch circuit is to detect short-circuit currents and shut them off in the shortest possible time taking into account the allowable overvoltage. It would also be desirable to avoid switching loads to short-circuits or to achieve the quickest possible shut-off if such switching occurs. Furthermore, instances of overload are detected and, if needed, shut off in the low-voltage branch circuits. The operating state of the branch circuit is reported for status monitoring.

European Patent No. 0 304 951 describes an electronic branch circuit switch for switching a load connected to a power supply source on and off, with two bidirectionally connected semiconductor switching elements connected in series with the load. No interrupting switching devices with an isolating distance are present in the load circuit.

U.S. Pat. No. 5,006,949 describes a device having a resistor and transistors, with which the current is switched off in the load circuit in the event of an overload. Furthermore, a control circuit designed as an optocoupler is described, which is capable of transmitting control signals to a semiconductor switching element without an electrical connection.

European Patent No. 0 421 891 describes a static isolating switch with electrical isolation, where a load having an upstream semiconductor switching element is supplied with direct current. The semiconductor switching element shuts off the current under normal conditions, as well as in the case of an overload or short-circuit. In the event of failure of the semiconductor switching element, the isolating switch in the load circuit is opened. An electromagnet connected in parallel to the load is used for triggering; the magnet armature position provides the opening command to the isolating switch. When the load is supplied from an AC source, two bidirectionally connected transistors are used instead of a semiconductor switching element.

German Patent No. 42 09 167 describes a switching and monitoring unit for electric drives. The unit is used, in particular, for switching and monitoring electric drives with operating voltages over 60 V, in particular for auxiliary and secondary drives, with the electric drives featuring switching elements, e.g., circuit breaker elements, protective switching elements, and current rectifiers. Instead of mechanical switches such as isolating switches and motor protection switches, semiconductor switching elements are connected upstream for switching in this case, and the actual operating status is picked up and conveyed to monitoring elements or circuits.

SUMMARY OF THE INVENTION

The object of the present invention is to provide a branch circuit switch with which the known branch circuit functions for switching a load on and off in normal operation and in fault operation (overload, short-circuit) are performed electronically, in a simple manner observing, in particular, the allowable overvoltages.

Figure 1:
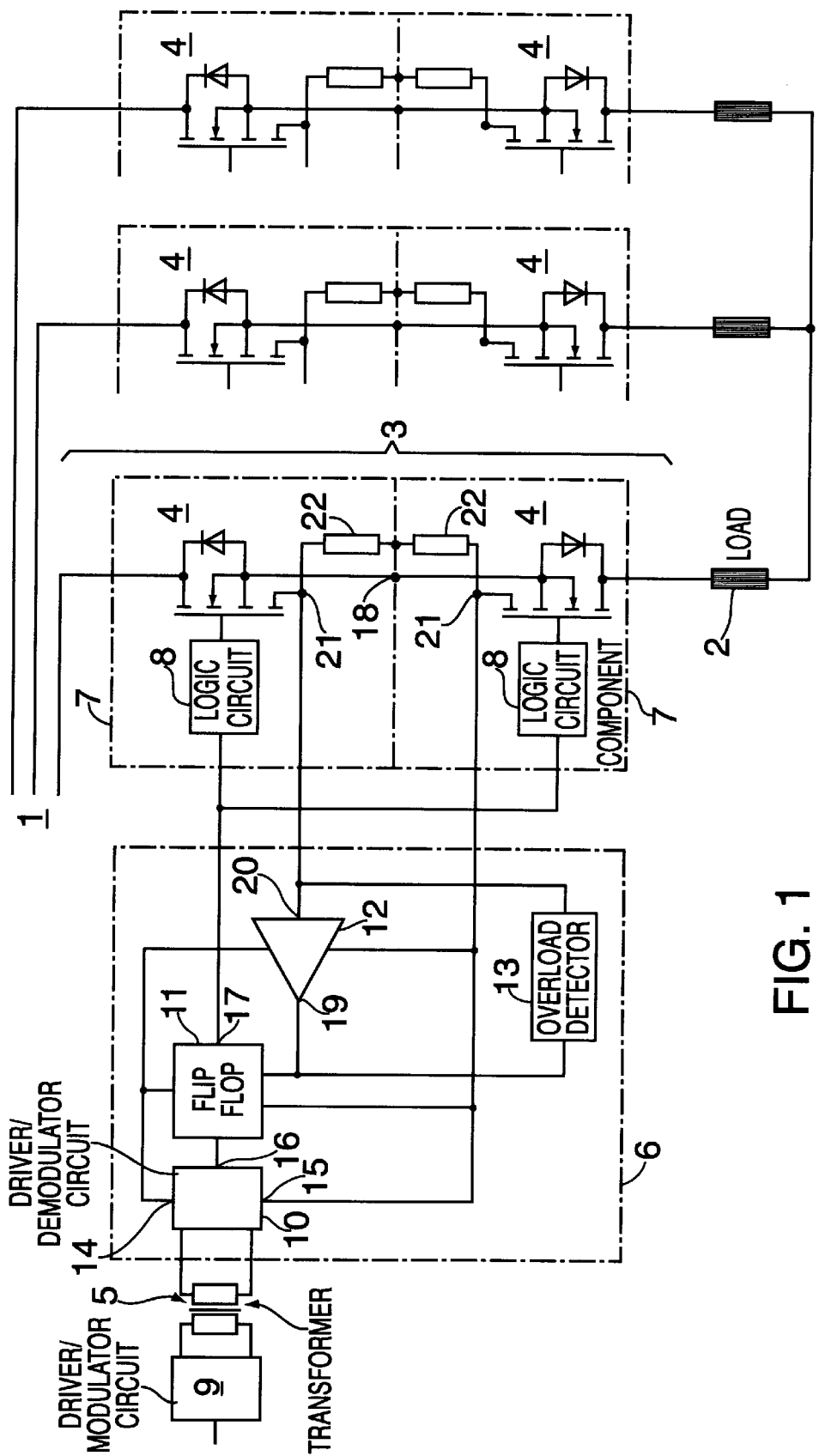
FIG. 1 shows a first circuit for an electronic branch circuit switch according to the present invention.

According to FIG. 1, a three-phase electronic branch circuit switch 3 is connected between a three-phase system 1 and a three-phase load 2; load 2, for example, a motor, can be supplied via this switch 3. Electronic branch circuit switch 3 has the same design in all three phases; therefore the design of only one phase is schematically shown here. Electronic branch circuit switch 3 has two bidirectionally connected semiconductor switching elements 4 connected in series with load 2, a potential-free control device 5, and a control circuit 6 connected between control device 5 and semiconductor switching elements 4. Semiconductor switching elements 4 are FETs in this case, implemented on a component 7, corresponding to the HITFET module but designed for much higher voltages, which also contains a logic circuit configured as a protective circuit 8. The semiconductor switching elements 4 may include a substrate composed of silicon carbide, for example. Furthermore, the semiconductor switching elements 4 and the logic circuit 8 may be included in a single integrated component 7, for example. More details on the design and function of HITFET components are contained in "HITFET Low-Side-Schalter für alle Fälle" (HITFET Low-side Switches for All Applications") in the journal Components 33 (1995), vol. 2, pp 59 ff. The potential-free control device is designed here as a transformer 5, to the primary side of which there is connected a driver/modulator circuit 9, implemented, for example, as component UC3724 from Unitrode Integrated Circuits. Control circuit 6 contains another driver component 10, e.g., UC3725 from Unitrode, a flip-flop 11, a comparator 12 and an overload detector 13. A driver/demodulator circuit 10 is connected to the secondary side of transformer 5 and connected to a comparator 12 and a flip-flop 11 through its terminals 14 and 15. Another terminal 16 of driver/modulator circuit 10 is connected with flip-flop 11, whose output is connected to component 7 via connecting point 17. Connecting point 15 of component 10 is electrically connected to tie point 18 between components 7. Flip-flop 11 is also connected to output 19 of comparator 12, whose input 20 is connected to connecting point 21 of ohmic resistor 22. The other connecting point of ohmic resistor 22 is tie connected to point 18. Overload detector 13 is located between input 20 and output 19 of comparator 12.

The operation of branch circuit switch 3 is described in detail below with reference to FIG. 1.

The two FETs 4 are used to switch the load circuit at rated load, overload and short-circuit. A bypass for measuring the load current is implemented in each component 7 with internal resistor 22 and a split source electrode. A constant percentage load current component May receive a voltage of the load from an ohmic resistor 22. Zero currents or load currents under a minimum threshold are detected with the help of comparator 12, to whose input the voltage drop across ohmic resistor 22 is applied. When the current drops below a minimum threshold representing zero current, flip-flop 11 forms a shutoff signal, with which FETs 4 are immediately shut off at zero crossing, which is useful for shutting off inductive loads. Logic circuit 8 in component 7 performs shut-off or current limitation in the event of a short circuit. The two components 9 and 10 form, together with transformer 5, a potential-free control and the power supply for flip-flop 11, comparator 12, and overload detector 13. Overload detector 13 also forms a trigger signal from the current signal and load over time after a threshold value has been exceeded.

Figure 2:
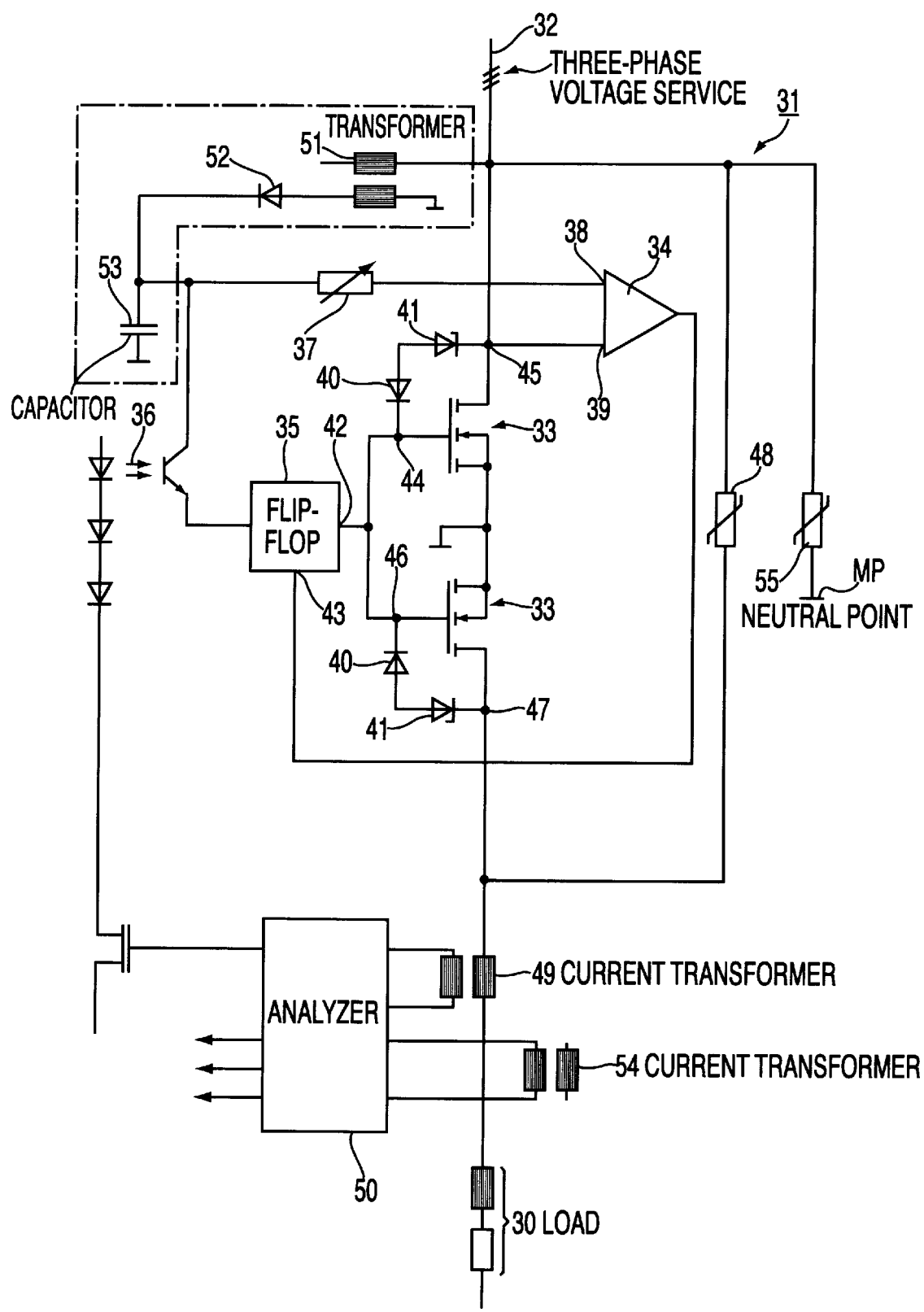
FIG. 2 shows a second circuit for an electronic branch circuit switch according to the present invention.

FIG. 2 shows another embodiment of the current supply to a load 30 via a branch circuit switch 31, with power being supplied via a three-phase voltage source 32. Branch circuit switch 31 is represented here for one phase only and includes two bidirectionally wired field-effect transistors 33 connected in series with load 30, a comparator 34, a flip-flop 35 and an optocoupler 36. Optocoupler 36 is connected to the positive pole of a DC power supply, which is indicated with broken lines in FIG. 2, and includes a transformer 51, a diode 52 and a capacitor 53. An adjustable ohmic resistor 37, also connected to the positive pole, is connected to input 38 of comparator 34, to whose other input 39 drain terminal 45 of one of FETs 33 is connected. Optocoupler 36 is also connected to flip-flop 35, whose one output 42 goes to gate terminals 44 and 46 of FETs 33 for control. The other output 43 of flip-flop 35 is electrically connected to the output of comparator 34. Two oppositely poled diodes 40, 41 are connected between gate terminals 44, 46 and drain terminals 45, 47, respectively, of FETs 33. A varistor 48 is connected between drain terminals 45 and 47. The primary winding of a current transformer 49 is connected between load 30 and drain terminal 47; the secondary winding of the current transformer is connected to an analyzer 50. Another current transformer 54 is connected to the analyzer as an Aron circuit. Another varistor 55 is connected between one phase of three-phase supply 32 for load 30 and its neutral point MP.

The operation of the branch circuit switch of FIG. 2 is elucidated in greater detail below.

Also here, the two FETs 33 are used to switch the load circuit at rated load, overload, and short-circuit. The overload and rated currents are measured using the drain-source voltage of one of the FETs 33, connected to input 39 of comparator 34. The latter is used, as in the previous embodiment, for detection of zero current or very low currents, which is indispensable for shutting off inductive loads. The connection of the two FETs 33 with diodes 40, 41 is used for limiting the short-circuit current and thus protects FETs 33. With optocoupler 36, the entire circuit of branch circuit switch 31 is controlled potential-free. Power is supplied to the entire circuit via the DC power supply, which includes transformer 51, diode 52, and capacitor 53. The two transformers 49 and 54 connected as an Aron circuit supply overload component 50, which can provide a threshold value for the current load, for example, at which a connected motor is shut off to protect it against overload. Analyzer 50 is known from the electronic overload relay model 3UB1 and 3RB1 by Siemens. The two varistors 48, 55 form an overload protection for branch circuit switch 31 against load 30 and against neutral point MP.

Electronic branch circuit switch 31 has the following functions:

shutoff in zero crossing for overload and rated load due to high load inductivities;

immediate shutoff and current limitation in the case of short-circuit;

potential-free control;

overload protection.

Although the present invention is explained with reference to the embodiment illustrated in the drawings, it must be taken into account that this is not intended to limit the invention to the embodiment presented, but to include all possible changes, modifications, and equivalent arrangements as long as they are covered by the content of the patent claims.

What is claimed is:

1. An electronic branch circuit switch for switching a load connected to a power supply source between an on state and an off state, comprising:

two semiconductor switching elements bidirectionally connected in series with the load;

wherein the electronic branch circuit switch does not include any switches with isolating distance to interrupt the load;

an ohmic resistor resistor connected across the current path of the load current for measuring the voltage of the load;

a potential-free control device coupled to the two semiconductor switching elements, the potential-free control device switching the two semiconductor switching elements between an on state and an off state;

a first protection device coupled to the two semiconductor switching elements, the first protection device shutting off a short-circuit current flowing through the load;

a second protection device coupled to the two semiconductor switching elements, the second protection device preventing an overload current in the load; and a detection device coupled to the load, the detection device detecting a zero crossing of a current of the load and generating a shutoff signal, the shutoff signal shutting off the two semiconductor switching elements, wherein the two semiconductor switching elements include a substrate composed of silicon carbide, and wherein the two semiconductor switching elements and the first protection device are included in a single integrated component.

2. The electronic branch circuit switch according to claim 1, further comprising:

a comparator receiving the voltage of the load; and a flip-flop being reset by the comparator and switching the two semiconductor switching elements to an off state if the voltage of the load falls below a predetermined threshold voltage.

3. The electronic branch circuit switch according to claim 1, further comprising:

a comparator having an input, the input receiving a voltage drop across at least one of the two semiconductor switching elements; and a flip-flop coupled with the comparator to shut off the at least one of the two semiconductor switching elements.

* * * * *